United States Patent
Wang et al.

(10) Patent No.: US 12,072,845 B2
(45) Date of Patent: Aug. 27, 2024

(54) SYSTEMS AND METHODS FOR PAIR-WISE DELTA COMPRESSION

(71) Applicant: MICROSOFT TECHNOLOGY LICENSING, LLC, Redmond, WA (US)

(72) Inventors: Xiaowen Wang, Redmond, WA (US); Lei Zhang, Kirkland, WA (US); Paul Martin Messing, Kirkland, WA (US); Chittibabu Pacharu, Bellevue, WA (US); Weijun Guo, Bellevue, WA (US); Kevin Alan Erickson, Monroe, WA (US); Shenghao Li, Redmond, WA (US); David Gregory Grant, Duvall, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 62 days.

(21) Appl. No.: 18/086,415

(22) Filed: Dec. 21, 2022

(65) Prior Publication Data
US 2024/0211442 A1   Jun. 27, 2024

(51) Int. Cl.
G06F 16/174    (2019.01)
H03M 7/30      (2006.01)

(52) U.S. Cl.
CPC ...... G06F 16/1744 (2019.01); H03M 7/3071 (2013.01); H03M 7/6011 (2013.01)

(58) Field of Classification Search
CPC .............. G06F 16/174; G06F 16/1744; G06F 16/1752; G06F 16/1756
See application file for complete search history.

(56) References Cited

U.S. PATENT DOCUMENTS

| | | | |
|---|---|---|---|
| 7,509,636 B2 | 3/2009 | Mcguire et al. | |
| 7,567,973 B1* | 7/2009 | Burrows | G06F 16/22 |
| 10,303,797 B1* | 5/2019 | Menezes | G06F 16/1727 |
| 10,831,725 B2* | 11/2020 | Shimanovsky | H04W 4/029 |
| 11,463,559 B1* | 10/2022 | Agarwal | H04L 69/04 |
| 2005/0022175 A1* | 1/2005 | Sliger | G06F 8/658 |
| | | | 717/169 |

(Continued)

OTHER PUBLICATIONS

Ouyang et al., "Cluster-based delta compression of a collection of files," Proceedings of the Third International Conference on Web Information Systems Engineering, 2002. WISE 2002., Singapore, 2002, pp. 257-266, doi: 10.1109/WISE.2002.1181662 (Year: 2002).*

(Continued)

*Primary Examiner* — James E Richardson
(74) *Attorney, Agent, or Firm* — Workman Nydegger

(57) ABSTRACT

Some disclosed embodiments are directed to methods and systems for performing pair-wise delta compression. For example, systems obtain a set of files to be compressed into a single compressed file. The system identifies different attributes related to the set of files. For each file in the set of files, the system predicts an optimized set of candidate compression files and calculates a delta between each file in the optimized set and the target file corresponding to the optimized set. After identifying the smallest delta, the system compresses the selected pair of files associated with the smallest delta in order to generate the single compressed file for the set of files.

20 Claims, 11 Drawing Sheets

(56) References Cited

U.S. PATENT DOCUMENTS

2014/0052700 A1* 2/2014 VanderSpek ........ G06F 16/1744
707/693
2014/0279757 A1* 9/2014 Shimanovsky ..... G06F 16/2477
706/12

OTHER PUBLICATIONS

"Data deduplication", Wikipedia, Jan. 3, 2022, pp. 1-7. Retrieved from https://en.wikipedia.org/w/index.php?title=Data_deduplication&oldid=1063566238.

Bloch, at el., "Deep String Matching for Duplicate Detection", SSRN Electronic Journal, Jun. 6, 2021, 27 pages.

International Search Report and Written Opinion received for PCT Application No. PCT/US23/036215, Feb. 7, 2024, 13 pages.

Liekah, et al., "Deduplication Over Heterogeneous Attribute Types (D-HAT)", International Conference on Advanced Data Mining and Applications, Nov. 24, 2022, pp. 379-391.

Park, et al., "DeepSketch: A New Machine Learning-Based Reference Search Technique for Post-Deduplication Delta Compression", 20th USENIX Conference on File and Storage Technologies, Feb. 22, 2022, pp. 247-264.

* cited by examiner

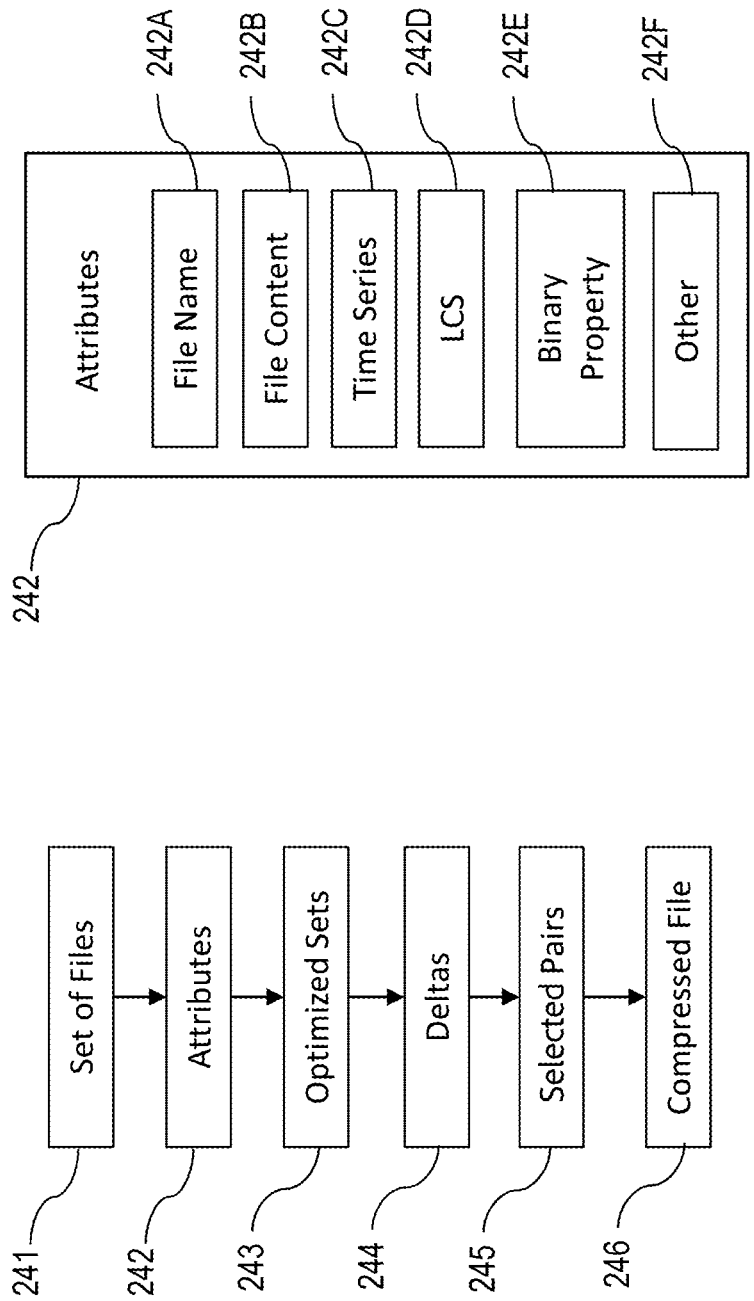

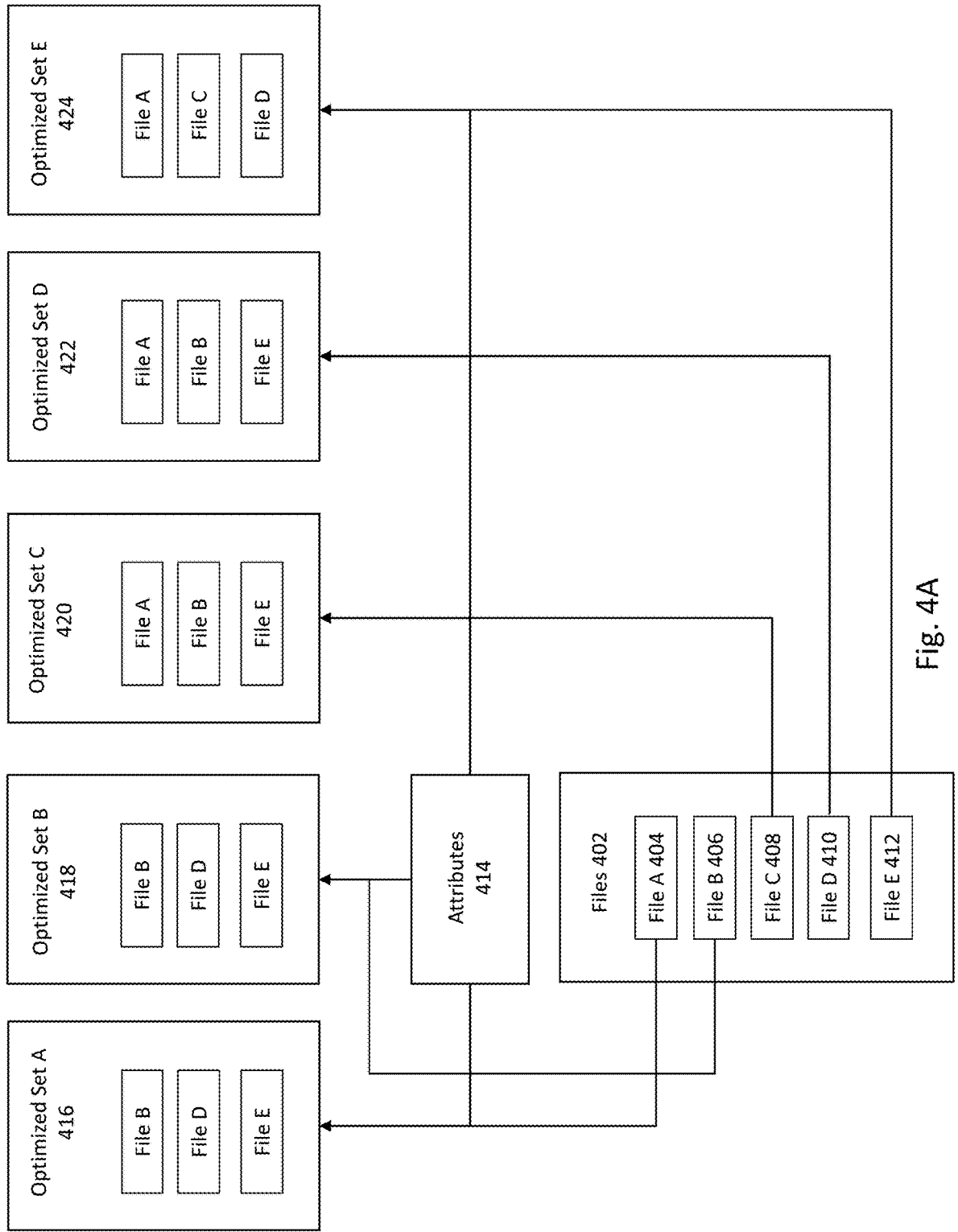

SYSTEMS AND METHODS FOR PAIR-WISE DELTA COMPRESSION

BACKGROUND

Data compression refers to the process of encoding, restructuring, or modifying data in order to decrease the size of the data. By reducing the size of the data, computing systems are improved by reducing the amount of storage needed, as well as reducing the bandwidth necessary to transmit the data. There are a few different types of data compression, including lossy compression and lossless compression. Lossy compression refers to the process of reducing data size by simplifying the dataset by removing unneeded information. While this method achieves relatively high compression ratios, original data information is lost in the process. In contrast, lossless compression refers to the process of locating and removing duplicate data which allows for data compression without losing any original information from the data. One type of lossless data compression is called delta encoding, or delta compression. In delta compression, the system determines differences (i.e., deltas) between files in the data package and then encodes a target file with respect to one or more reference files using the determined deltas between the various files.

Delta compression is especially effective in cases where there is a significant amount of duplicate data between target and reference files. Common applications that may utilize data compression techniques include revision control systems and versioned file systems that have many versions of a file or software program. For example, users of different operating systems and/or software programs may need to update the system or software as system/program administrators make changes to a previous version of the system or program. However, these software updates have become increasingly more frequent and more complex, resulting in bigger and bigger data packages being transmitted to users at higher costs.

In view of the foregoing, there is an ongoing need for improved systems and methods for compressing data, especially in applications of software update packages.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Disclosed embodiments include systems, methods, and devices for performing pair-wise delta compression and, even more particularly, for performing pair-wise delta compression with the use of deep learning models to predict, select and use file pairings having the deltas identified for improving the efficiencies associated with utilizing the pair-wise compression.

For example, systems are provided for obtaining a set of files to be compressed into a single compressed file. Systems identify a set of attributes that are associated with each file in the set of files and possible file pairs in the set of files. For each particular file in the set of files, the systems predict an optimized set of candidate compression files to be paired with said particular file. The optimized set of candidate compression files comprises a subset of the set of files that are selected based on the set of attributes.

Subsequently, the systems calculate a delta between each particular file and a plurality of the predicted optimized set of candidate compression files to identify a selected pairing of each particular file with a selected file from the predicted optimized set of candidate compression files. The selected pairing is based on a determination that the selected pairing has a smallest or smaller delta relative to other file pairings between said each particular file and other files in the optimized set of candidate compression files. Finally, systems compress the set of files by compressing each selected pairing into the single compressed file.

Some disclosed embodiments are also directed to using a deep learning model to perform pair-wise delta compression. For example, systems obtain a set of files to be compressed into a single compressed file and identify a set of attributes that are associated with each possible file pair in the set of files. The systems then apply a machine learning model to the set of files and set of attributes. The machine learning model is trained to predict candidate compression files for the set of files.

For each particular file in the set of files, the systems predict an optimized set of candidate compression files to be paired with said particular file based on the attributes of the files. Subsequently, the systems calculate a delta between each particular file and a plurality of the predicted optimized set of candidate compression files to identify a selected pairing of each particular file with a selected file from the predicted optimized set of candidate compression files. The preferred pairing is based on a determination that the selected pairing has a smallest or smaller delta relative to other file pairings between said each particular file and other files in the optimized set of candidate compression files. Finally, systems compress the set of files by compressing each selected pairing into the single compressed file.

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which:

FIG. 2B illustrates an example flow diagram for generating a compressed file.

FIG. 2C illustrates various types of attributes that are used in generating compressed files.

FIGS. 4A-4D illustrate an example process flowchart for performing pair-wise delta compression according to disclosed embodiments.

DETAILED DESCRIPTION

Disclosed embodiments are directed toward systems and methods for compressing data. In this regard, it will be appreciated that some of the disclosed embodiments are specifically directed to improved systems and methods for improving pair-wise delta compression by predicting, selecting, and using top candidate compression files for a particular target file during the compression of the files. The disclosed embodiments provide many technical advantages over existing systems, including the reduction of compressed file sizes and the lowering of costs associated with performing the compression, as will now be described in more detail.

Figure 1:
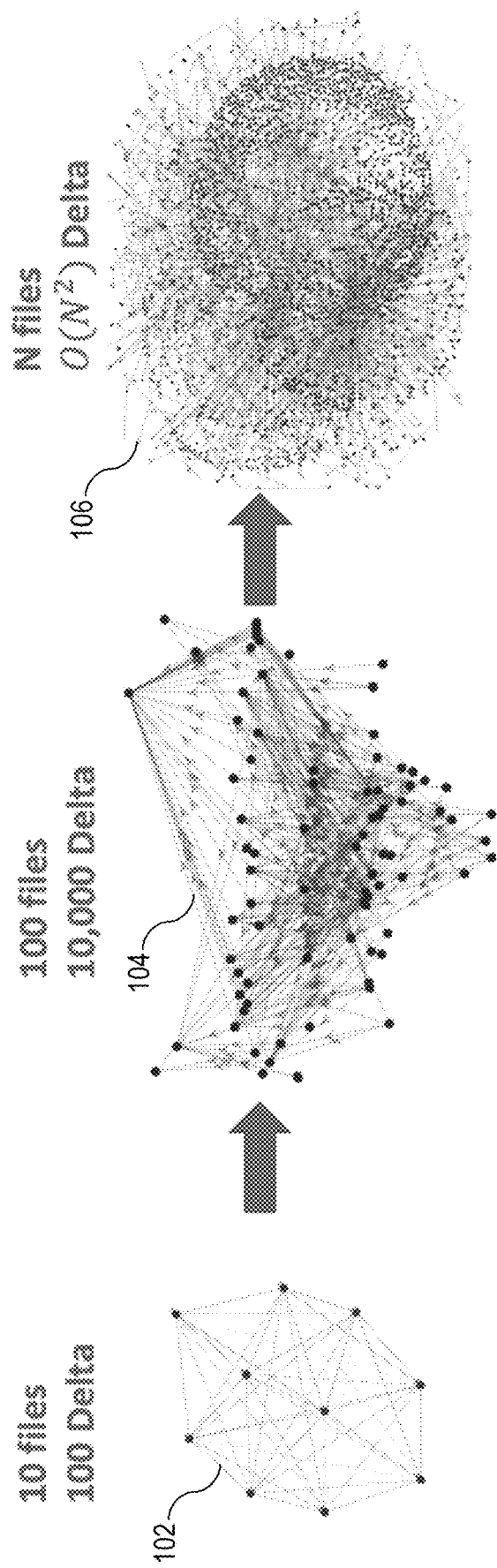
FIG. 1 illustrates a conventional method for performing pair-wise delta compression.

Attention will first be directed to FIG. 1, which illustrates a conventional method for performing delta compression, and which highlights various problems with current delta compression methods. For example, in conventional methods of delta compression, all possible file pairs for a particular set of files are identified and a delta is calculated for each possible file pair. The conventional system then selects the file pairs associated with the lowest deltas, from the complete list of all possible file pairs and compresses those file pairs which correspond to the lowest deltas. This process is effective when the file set has a low number of files (e.g., 10 files) wherein the system calculates a reasonable number of deltas (e.g., 100 deltas) in order to select the deltas for a file set (e.g., file set 102). Similarly, referring to file set 104, if there are 100 files, the system must calculate 10,000 deltas. In summary, as illustrated by file set 106, for N number of files, the system must calculate $N^2$ number of deltas. Thus, for an increasing number of files, the computational expense is exponentially increased. This in turn increases the total amount of time required for compression and delays sending out updates to software programs and operating systems.

These shortcomings are compounded when systems are required to send out more frequently occurring updates to increasing numbers of customers. For example, an operating system (e.g., Windows) may release updates to millions and, sometimes, even billions of devices every month to keep customers productive and protected with the most up-to-date versions of the operating system. Each update comprises a large amount of data that is compressed and transmitted to a client. Each file set can be up to 1.5 GB or more. Sending these updates requires high bandwidth and storage. For such a large file set, conventional compression methods are not optimized to identify the deltas for performing the pair-wise delta compression that will result in a relatively smaller or smallest file size. Furthermore, conventional methods for delta compression are not efficient and, because of their inefficiencies, are not configured for use in cloud environments. In contrast, the disclosed embodiments improve efficiencies associated with compressing files and are, therefore, more suitable for use in the cloud environment.

As described herein, many of the efficiency gains of the disclosed embodiments are based on the manner in which the disclosed systems predict which possible file pairs will be the file pairs that will result in a decreased or smallest file size during pair-wise delta compression. Additional technical benefits are achieved by selectively calculating deltas for only a limited set of file pairings, rather than for all possible file pairs, which reduces compression time. The limited set of file pairs includes file pairs that have been predicted to have lower deltas than other possible file pairs or have the lowest deltas of all possible file pairs that can be selected from the set of files. Additionally, because the file pairs with the lower or least deltas are selected, this also achieves significant improvement in the compression ratio for a set of files.

These disclosed embodiments can be applied to compressions of any file set leveraging binary delta compression. Thus, given any set of files, the disclosed systems know how to find the deltas for each target file included in the set of files which will result in a decreased file size as compared to conventional systems for performing pair-wise data compression. The system is configured to optimize for the smaller or smallest final compressed file, a shorter or shortest compression time, or a combination of both aforementioned features.

By optimizing for the smaller or smallest compressed file, systems are able to achieve reduced storage/memory on both the server and client systems. The bandwidth that is required to transmit the data package is also reduced, which in turn decreases the transmission time. By optimizing for the shorter or shortest compression time, systems are able to decrease the overall time between generating the updated data package and users being able to use the updated data package. By optimizing for a combination of both attributes, systems achieve a combination of the aforementioned technical advantages. In any of these cases, user experience is also improved by streamlining the system or program update process.

Figure 2A:
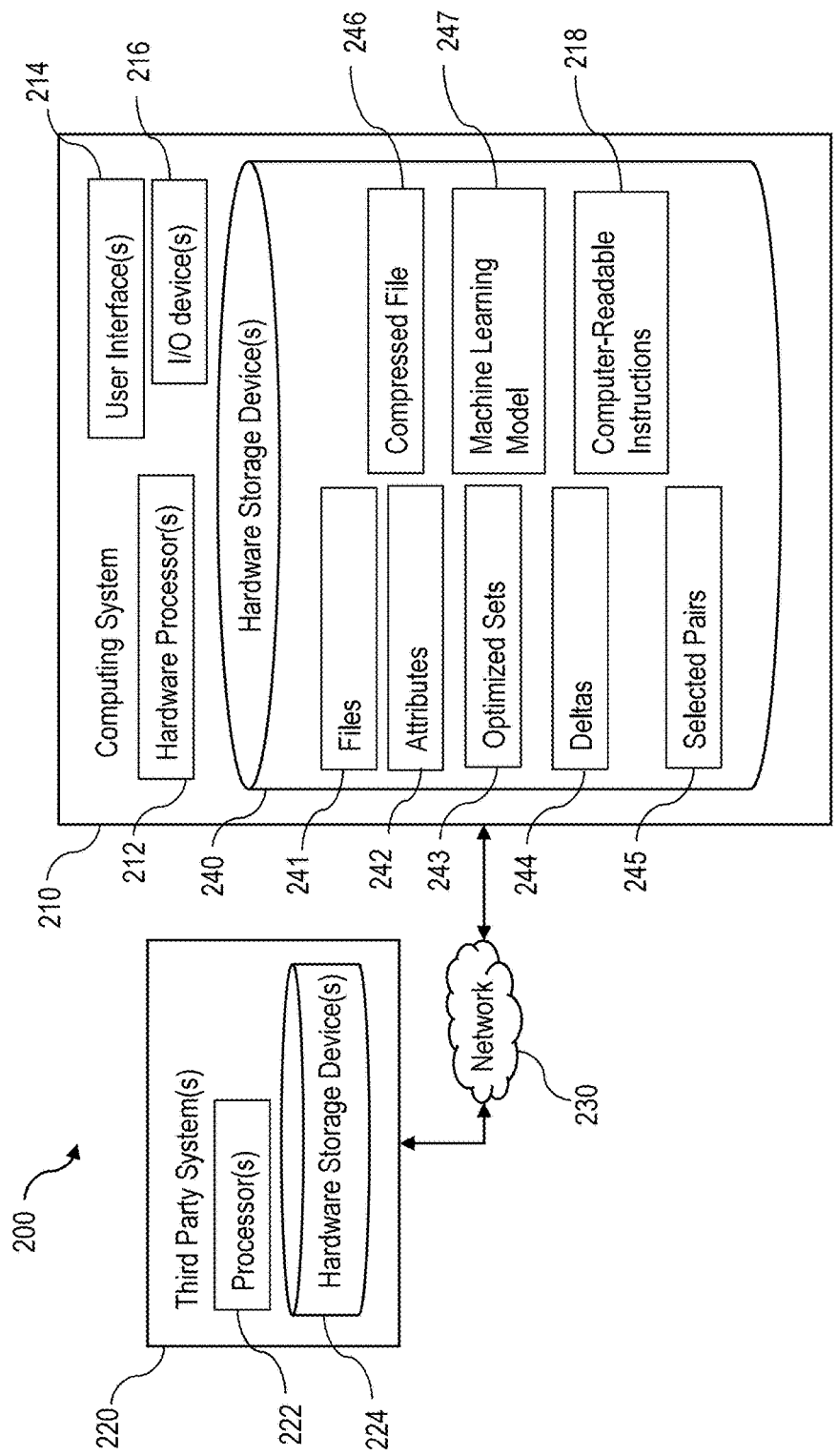
FIG. 2A illustrates a computing environment in which a computing system incorporates and/or is utilized to perform disclosed aspects of the disclosed embodiments.

Attention will now be directed to FIG. 2A, which illustrates a computing environment 200 that also includes third-party system(s) 220 in communication (via network 230) with a computing system 210, which incorporates and/or is utilized to perform disclosed aspects of the disclosed embodiments. Third-party system(s) 220 includes one or more processor(s) 222 and one or more hardware storage device(s) 224. In some instances, these third-party systems include one or more client systems that receive compressed files (e.g., software update packages) from the computing system 210, which generates the compressed files.

The computing system 210 is configured to perform improved pair-wise delta compression in accordance with the disclosed techniques. The computing system 210, for example, includes one or more processor(s) (such as one or more hardware processor(s) 212) and a storage (i.e., hardware storage device(s) 240) storing computer-readable instructions 118 wherein one or more of the hardware storage device(s) 240 is able to house any number of data types and any number of computer-executable instructions 218 by which the computing system 210 is configured to implement one or more aspects of the disclosed embodiments when the computer-executable instructions 218 are executed by the one or more processor(s) 212. The computing system 210 is also shown including user interface(s) 214 and input/output (I/O) device(s) 216.

As shown in FIG. 2A, hardware storage device(s) 240 is shown as a single storage unit. However, it will be appreciated that, in some instances, the hardware storage device(s) 240 is a distributed storage that is distributed to several separate and sometimes remote systems and/or third-party system(s) 220. The computing system 210 may also comprise a distributed system with one or more of the components of computing system 210 being maintained/run by different discrete systems that are remote from each other and that perform different tasks. In some instances, a plurality of distributed systems performs similar and/or shared tasks for implementing the disclosed functionality, such as in a distributed cloud environment.

The hardware storage device(s) 240 are configured to store and/or cache in a memory store the different data types including files 241, attributes 242, optimized sets 243, deltas 244, selected pairs 245, and compressed files 246. Files 241 include uncompressed files, such as data software updates and other datasets. Optimized sets 243 include a plurality of different candidate compression files to be used in performing pair-wise delta compression with a particular target file. Deltas 244 refer to the calculated or determined difference between different file pairs. Selected pairs 245 refer to the combination of (i) a target file identified from the set of files that has been designated for compression and (ii) a particular reference file that has been selected from the optimized set of files generated for the target file. After a selected pair is generated for every target file in the set of files, the computing system 210 performs pair-wise compression on the selected pairs to generate a compressed file that can be transmitted to another system (e.g., third-party system(s) 220). Compressed files 246 include files from files 241 which have been compressed according to disclosed embodiments. Such files can include, for example, Cabinet or CAB files, which are used as the compressed file format for many Microsoft Windows update packages. It will be appreciated, however, that other file types can also be used, besides CAB files. Hardware storage device(s) 240 also store a machine learning model 247 which is configured to perform pair-wise delta compression according to disclosed embodiments.

In some embodiments, the machine learning model 247 is a deep learning model or a learning to rank (LTR) model. LTR models are supervised machine learning models that are trained to optimize the order of items. Compared to classification or regression models, LTR models are not trained to consider exact scores or predictions, but the relative order of the output. Systems and methods herein may use a pairwise LTR model to optimize the relative order of file pairs.

Systems also employ a deep learning framework for quick and easy model design and training. Technical benefits also include being able to utilize higher-level APIs, which leads to better readability, easier use, and faster experimentation of models.

Some disclosed embodiments are directed to training a machine learning model to predict file pairs with relatively lower or lowest deltas as compared to other possible file pairs. For example, in some instances, based on multiple individually pre-trained content similarity models, such as term frequency-inverse document frequency (TFIDF) or control flow graph (CFG), systems generate a priority of delta compression pairs. The top priority pairs and some random pairs are selected as training data to train the model to predict file pairs with relatively low deltas. Such training improves efficiency and improves model performance.

Attention will now be directed to FIG. 2B, which illustrates an example flow diagram for generating a compressed file. For example, a set of attributes 242 is extracted from a set of files 241. Based on this set of attributes 242, an optimized set of candidate compression files (i.e., reference files) are generated for each file in the set of files. For any particular target file included in the set of files, the optimized set corresponding to the particular target file represents a grouping of top reference files that will yield the lowest deltas between the reference files and the target file. A delta is calculated between each file included in the optimized set and the target file for which the optimized set was generated. Then based on analyzing the deltas, and identifying the lowest delta, or one of the lowest deltas, a selected pair of files is selected. Once a selected pair of files is selected for each target file, a compressed file is generated by performing pair-wise delta compression on the selected pairs of files.

Attention will now be directed to FIG. 2C, which illustrates various types of attributes that are used in generating compressed files. For example, one or more attributes that are used in generating the optimized sets include the file name 242A, file content 242B, time series feature 242C, longest common subsequence (LCS) 242D, binary property 242E, and/or other feature(s) associated with the files, or pairs of files. The file name 242A refers to the name under which the particular file is stored and/or against which a query would return the file. File content 242B refers to the actual content of the file, from which further attributes can be extracted, in some instances.

Figure 3:
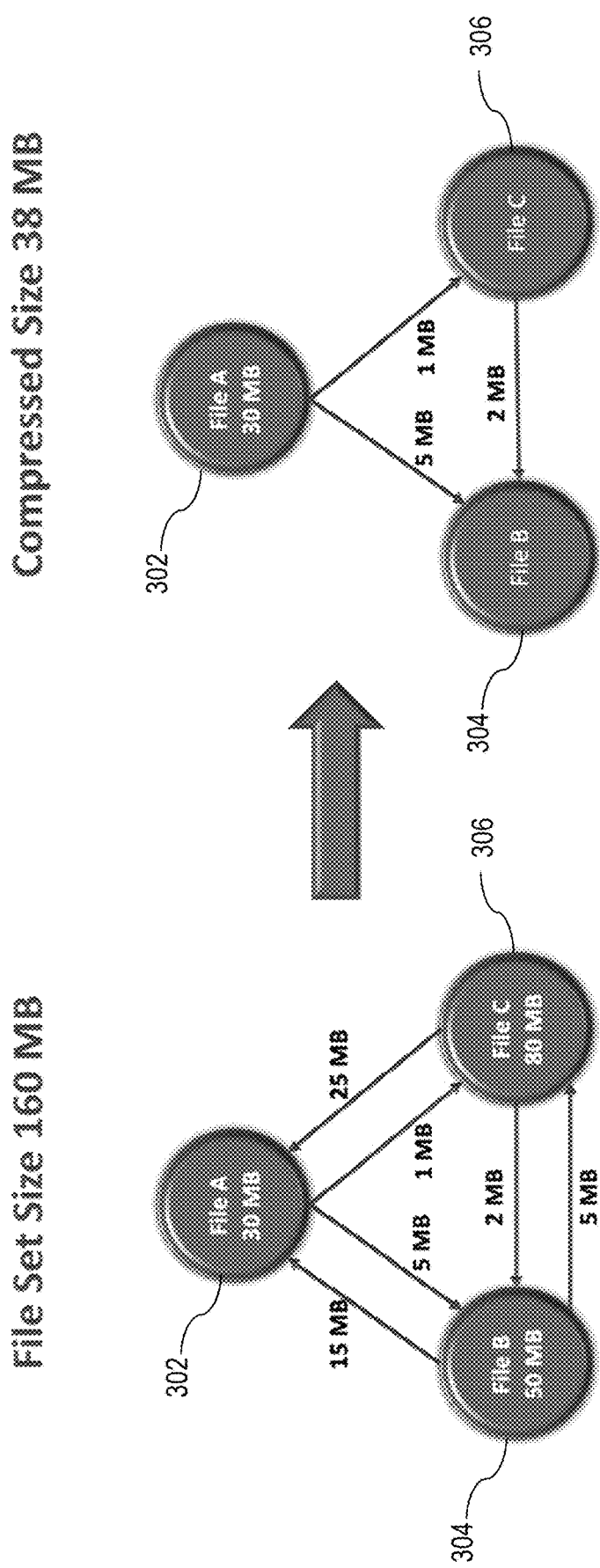
FIG. 3 illustrates an example diagram for performing pair-wise delta compression.

FIG. 3 illustrates an example diagram for performing pair-wise delta compression. For example, the file set on the left includes three files, file 302 (i.e., File A), file 304 (i.e., File B), and file 306 (i.e., File C). Together, in an uncompressed format, this set of files is 160 MB. In order to perform delta compression, a delta is calculated between each file pair. For example, for File A as the target file, a delta is calculated between File A and File B (e.g., 5 MB) and between File A and File C (e.g., 1 MB). A delta is also calculated between File B and File A (e.g., 15 MB) and between File B and File C (5 MB). Finally, a delta is calculated between File C and File B (e.g., 2 MB) and a delta between File C and File A (e.g., 25 MB). In this embodiment, the system will compress the set of files by identifying the file pairs with the lowest deltas (i.e., that will yield the smallest final file size for the set of files). For example, File A and File B are compressed at 5 MB, File A and File C are compressed at 1 MB, and File C and File B are compressed at 2 MB. Because File A is the file from which File B and File C can be reconstructed based on the deltas, the total size of the compressed file is 38 MB. This is significantly less than the original file set size of 160 MB.

As file size increases, the system is configured to predict which file pairs will yield the lowest deltas. The system can then perform calculations of deltas only on the top candidates, instead of all possible file pair options. This reduces the processing time significantly and allows for the file to be compressed faster and transmitted faster.

Figure 4B:
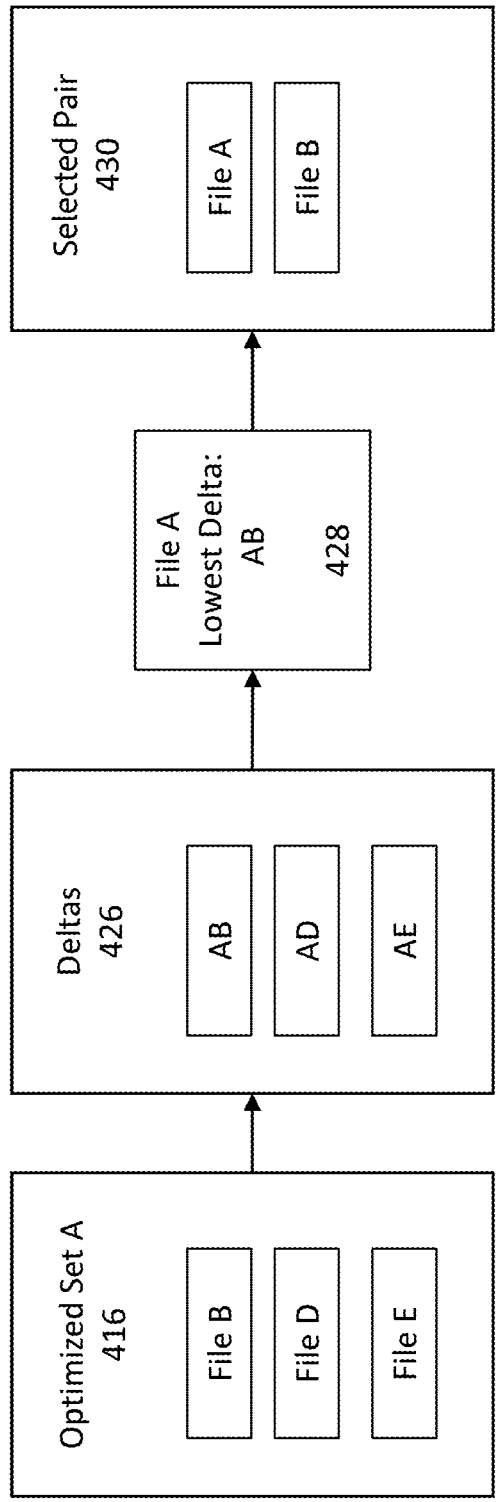

Attention will now be directed to FIGS. 4A-4D, which illustrate an example process flowchart for performing pair-wise delta compression according to disclosed embodiments. As illustrated in FIG. 4A, a set of files 402 includes file 404 (i.e., File A), file 406 (i.e., File B), file 408 (i.e., File C), file 410 (i.e., File D), and file 412 (i.e., File E). While FIG. 4A illustrates a set of files including five discrete files, it should be appreciated that the set of files to be compressed may include any number of different files.

The computing system extracts and/or identifies a set of attributes 414 for each file and/or between each potential file pair. These attributes 414 are representative of attributes 242 in FIGS. 2A and 2B and are used to predict an optimized set of reference files for each target file. For example, one or more attributes are identified for File A. Additionally, or alternatively, attributes are identified for each potential file pair including File A (e.g., File A and File B, File A and File C, File A and File D, and File A and File E). It would be too computationally expensive to calculate the delta between each of these possible file pairs. In order to reduce the overall compression time, the system generates an optimized set of files from the possible files. As illustrated in FIG. 4A, the system determined, based on attributes 414, that the candidate reference files for File A are File B, File D, and/or File E, as included in optimized set 416. in other words, the system determined that pair-wise compression between a file pair including File A and File B, or between a file pair including File A and File D, or between a file pair including File A and File E would yield the lowest delta for target file A.

The system selects the file pairs with the lower deltas relative to other file pairs in order to generate a smaller overall compressed file than would occur if other file pairs with higher deltas were selected. In some instances, the system selects the file pairs with the lowest deltas in order to generate the smallest overall compressed file available for the original set of files. This is in contrast to conventional systems which are unable to determine which files pairs will yield in smaller overall compressed file during pair-wise data compression because it would require an unreasonable amount of computational time and expense, especially for update packages that need to be generated and transmitted within a limited time frame.

Similar to generating optimized set 416 for File A, the system generates an optimized set for each of the files included in the set of files 402. For example, optimized set 418 is generated for File B and includes File B, File D, and File E. Optimized set 420 is generated for File C and includes File A, File B, and File E. Optimized set 422 is generated for File D and includes File A, File B, and File E. Optimized set 424 is generated for File E and includes File A, File C, and File D.

While each optimized set illustrated in FIG. 4A includes three possible reference files for each target file, it should be appreciated that the system can be configured to generate/predict any number of candidate compression files or candidate compression file pairs. In some instances, the system may predict the same or different numbers of candidate compression files for different target files.

Attention will now be directed to FIG. 4B. As illustrated in FIG. 4B, the system calculates the deltas 426 between each candidate compression file in the optimized set and the target file corresponding to the optimized set. For example, the system computes a delta between File A and File B (e.g., delta AB), between File A and File D (e.g., delta AD), and between File A and File E (e.g., delta AE). The system then identifies the lowest/smallest delta. The selected pair 430 is selected based on this identified delta. As illustrated in FIG. 4B, the system identified delta AB as the smallest delta 428, such that the selected pair 430 includes File A and File B. Thus, the system compresses the file pair including File A and File B.

Figure 4C:
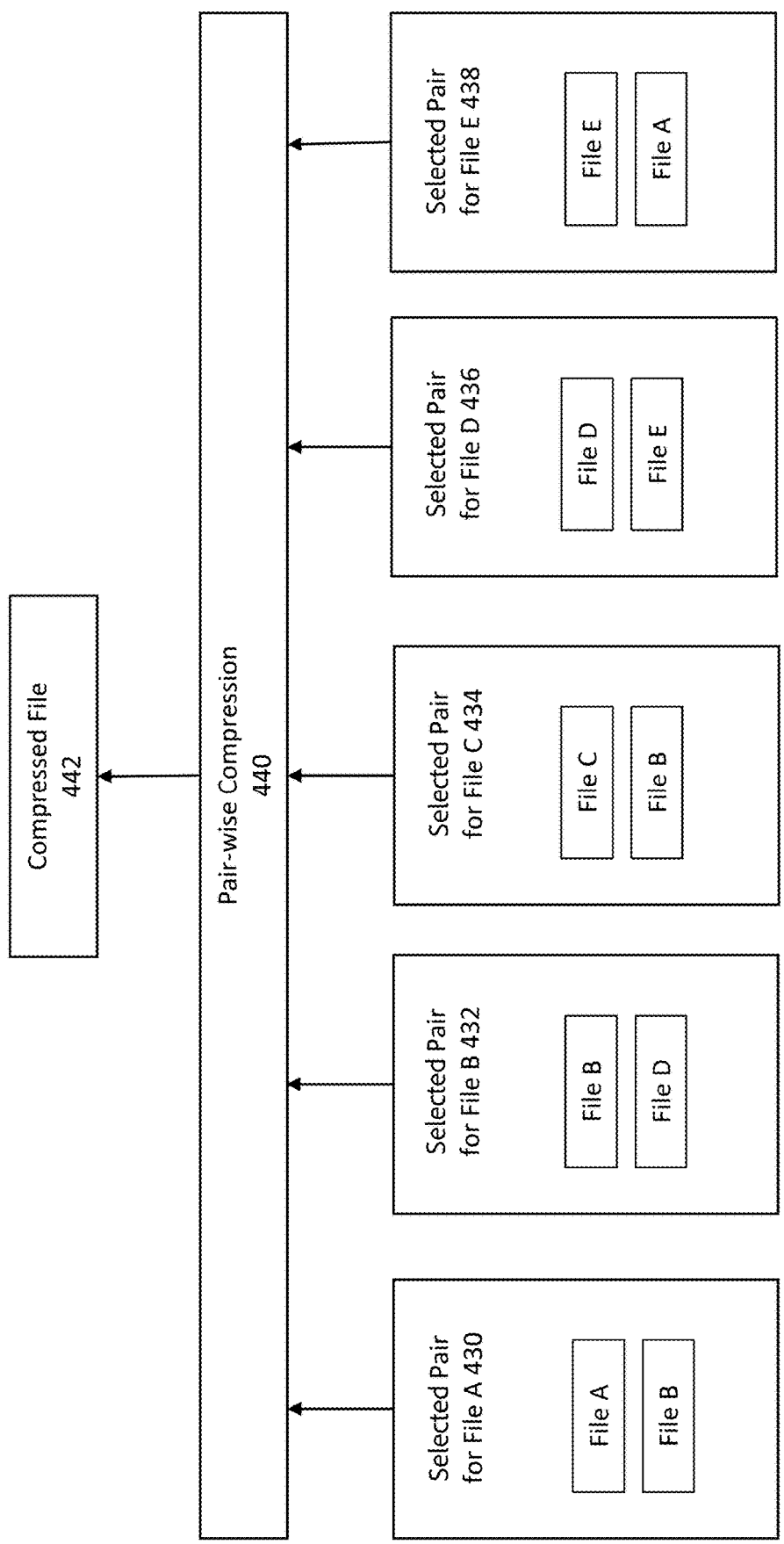

Attention will now be directed to FIG. 4C. As illustrated in FIG. 4C, a selected pair is generated for each of the files included in the original file set based on a similar process which was depicted in FIG. 4B, in reference to File A. For example, the system determined that the delta between File B and File D was the smallest delta, thus the selected pair 432 for File B includes File B and File D. The selected pair 434 for File C includes File C and File B. The selected pair 436 for File D includes File D and File E, and the selected pair 438 for File E includes File E and File A. Each selected file pair is compressed using pair-wise compression 440 in order to generate the final compressed file 442. The compressed file 442 comprises a smaller total file size than the original file set 402.

As illustrated in FIG. 4C, all of the selected pairs were used in compressing the file set. However, in some instances, the system selects only certain selected pairs, the combination of which can be used to reconstruct all the files. For example, in some instances, the system only uses selected pair 430 (e.g., File A and File B), selected pair 434 (e.g., File C and File B), and selected pair 436 (e.g., File D and File E). This combination of selected pairs includes a pair-wise compression covering each of the original five files included in the set of files 402.

Figure 4D:
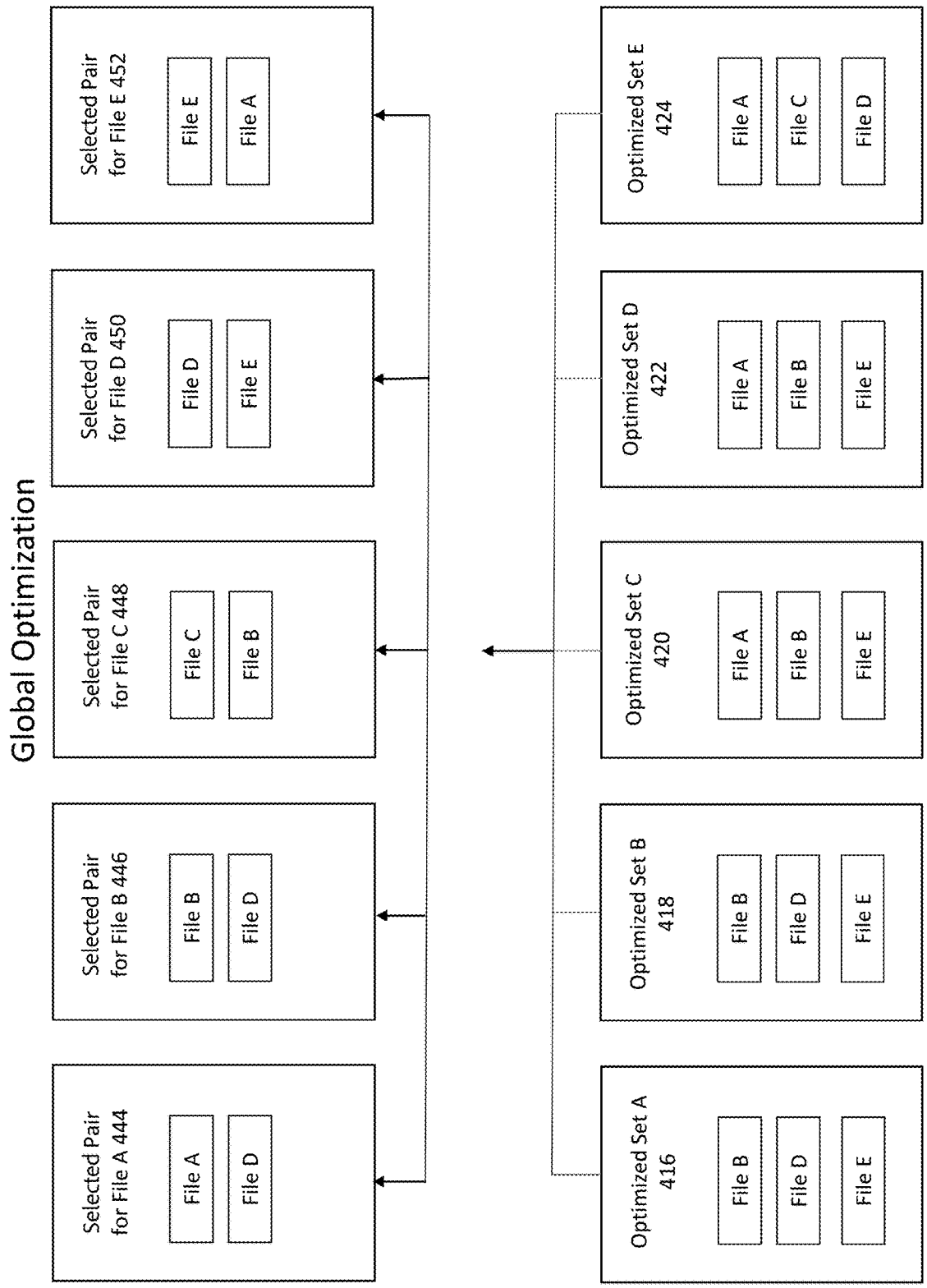

Attention will now be directed to FIG. 4D. In some embodiments, a global optimization is applied to the generation of selected pairs for each target file.

One goal of pair-wise data compression is to generate a compression file that has the smallest file size in the shortest amount of time, not just find the file pairs with the smallest deltas. For example, in some instances, the method (illustrated in FIGS. 4A-4C), which shows the system identifying the selected pair for each target file without referencing each of the other possible file pairs in other optimized sets for different target files may yield a small file size, but not yield the smallest file size in the shortest amount of time. To help address this additional time limitation, a global optimization can be further applied to the initial selection of the selected pairs for each target to further decrease the size of the final compressed file in a reduced amount of time.

Thus, the system analyzes each potential pair of files across all optimized sets (e.g., optimized set 416, optimized set 418, optimized set 420, optimized set 422, and optimized set 424) in order to generate the plurality of selected pairs (e.g., selected pair 444, selected pair 446, selected pair 448, selected pair 450, and selected pair 452). Thus, as illustrated in FIG. 4D, applying a global optimization to the generation of selected pairs yields different selected pairs as compared to the generation of selected pairs independent from other optimized sets as illustrated in FIG. 4B. For example, the selected pair 444 for File A now includes File A and File D, instead of File A and File B. While File A and File D may not have a smaller delta than File A and File B the system determined that compression between File A and File D, relative to the other selected pairs that would be compressed, would yield a smaller final file size of the compressed file.

Figure 5:
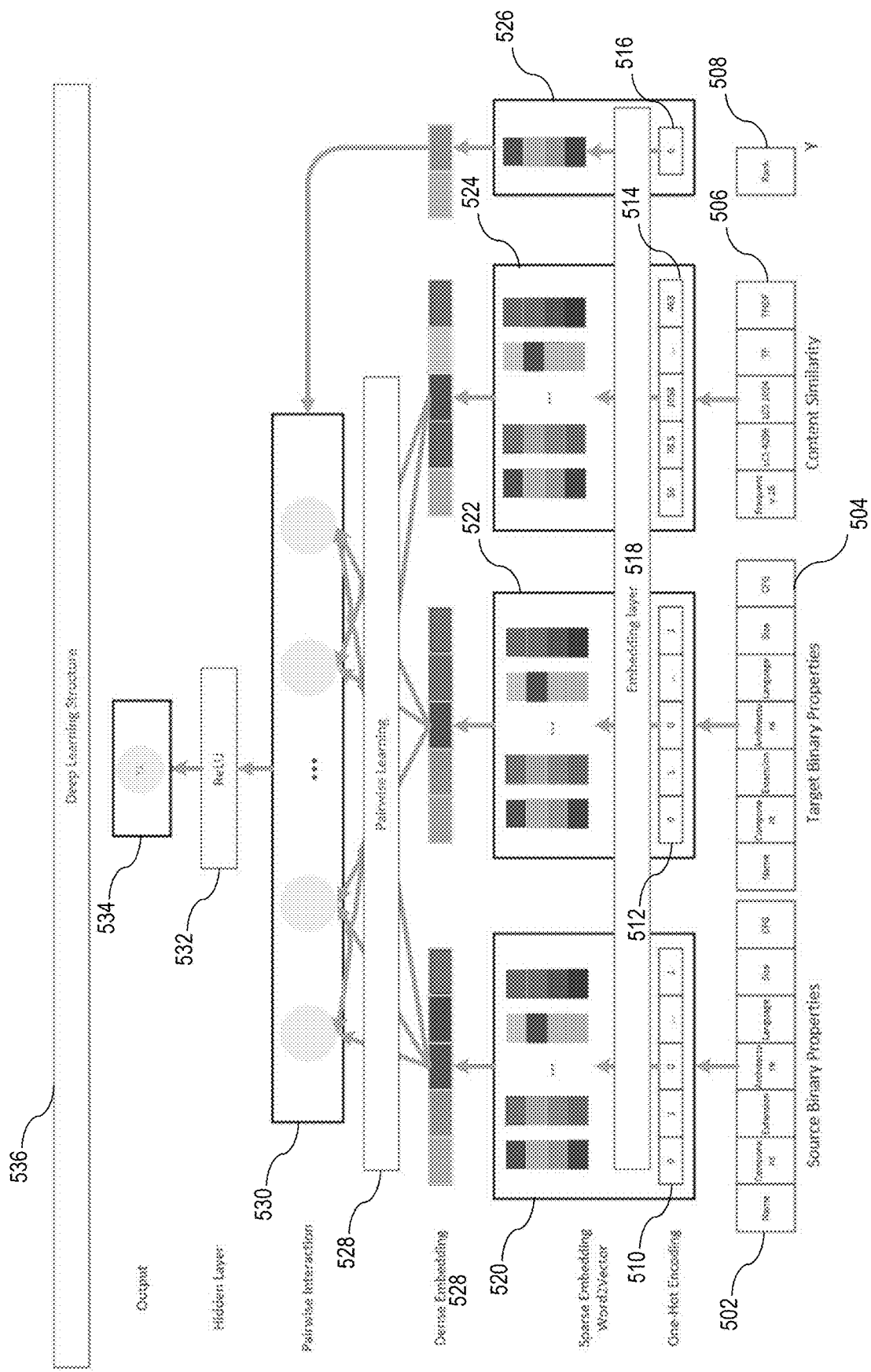
FIG. 5 illustrates an example process flowchart for compressing a selected pair of files based on different attributes of the file pair.

Attention will now be directed to FIG. 5, which illustrates an example process flowchart for compressing a selected pair of files based on different attributes of the file pair using a deep learning process 536. For example, a first set of attributes 502 has been identified for a first file (i.e., source file) and a second set of attributes 504 has been identified for a second file (i.e., target file). In some instances, the first file and second file are representative of files included in a selected pair of files as illustrated in FIGS. 4A-4D. In some instances, these sets of attributes are different binary properties of each file. For example, one or more attributes include a file name, a file component, a file extension, a file architecture, a language associated with the file, or other language-based property, a size of the file, and/or a CFG corresponding to the file.

The system also generates attributes related to the content similarity 506 between the two different files. Some content similarity features include frequency, LCS at 4096 bytes, LCS at 1024 bytes, TF, and TFIDF. In some instances, the system also predicts rank 508 as a type of model prediction scoring label during the compression process. Encoding 516 and the corresponding sparse embedding 526 are also part of the model prediction labeling. An LCS shingle at 4096 bytes has higher precision than the LCS shingle at 1024 bytes, meaning it has a higher chance to find the similarity files with high similarity. A shingle is a subsequence of tokens within a final that can be used to determine the similarity between files. Each set of attributes is encoded to generate a binary attribute set 510 corresponding to the first set of attributes 502, a binary attribute set 512 corresponding to the second set of attributes 504, and a binary attribute set 514 corresponding to content similarity 506.

An embedding layer 518 is applied to the different binary attribute sets, wherein a machine learning model configured to convert tokens to vectors (e.g., a Word2Vector model) is applied to perform sparse embedding on the encoded binary attribute sets to generate sparse embedding 520, sparse embedding 522, sparse embedding 524 and sparse embedding 526. The system is then configured to perform dense embedding on the different sparse embeddings. Sparse embeddings, or sparse representations, typically have a long vector length which can require large computing memory and high computational expense to process. In contrast, dense embeddings have shorter vector lengths which are less computationally expensive to process than sparse embeddings. By reducing the vector length, the system is better able to model the number of machine learning model parameters to train or use during pair-wise data compression.

These dense embeddings are then fed to a pair-wise learning layer 528, where the system is able to learn the different attributes of the files and corresponding model parameters. The system is then able to analyze the pair-wise interaction 530 between the first file and the second file based on the different attributes included in the sets of attributes associated with each of the first file and second file. A hidden layer 532 is applied to the output from the pair-wise interaction layer 530 in order to generate the final output 534. This final output, as processed by the aforementioned layers, can now be used to generate the desired compressed file.

Figure 6:
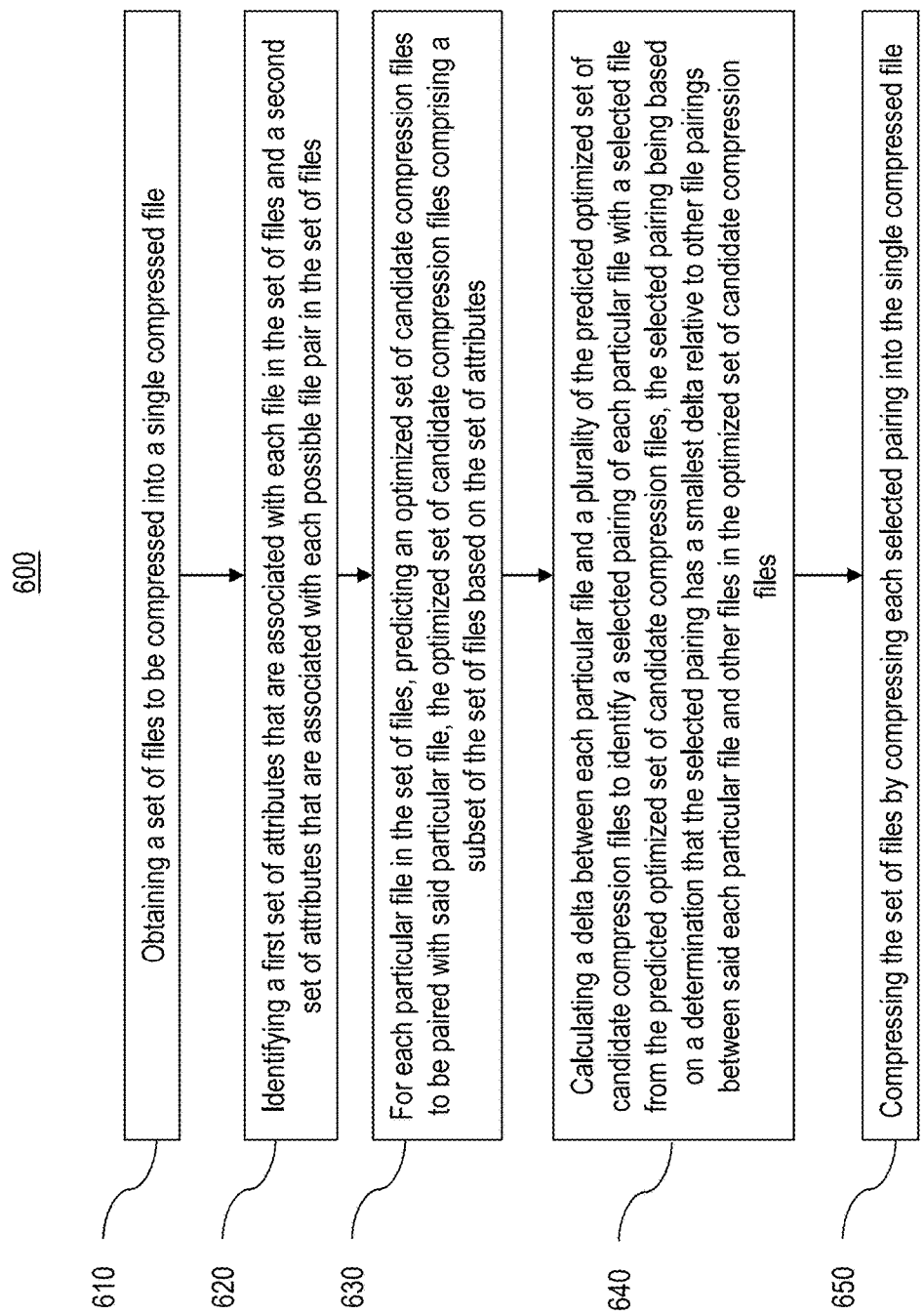
FIGS. 6-7 illustrate various embodiments of flow diagrams having a plurality of acts for performing pair-wise delta compression according to disclosed embodiments.
Figure 7:
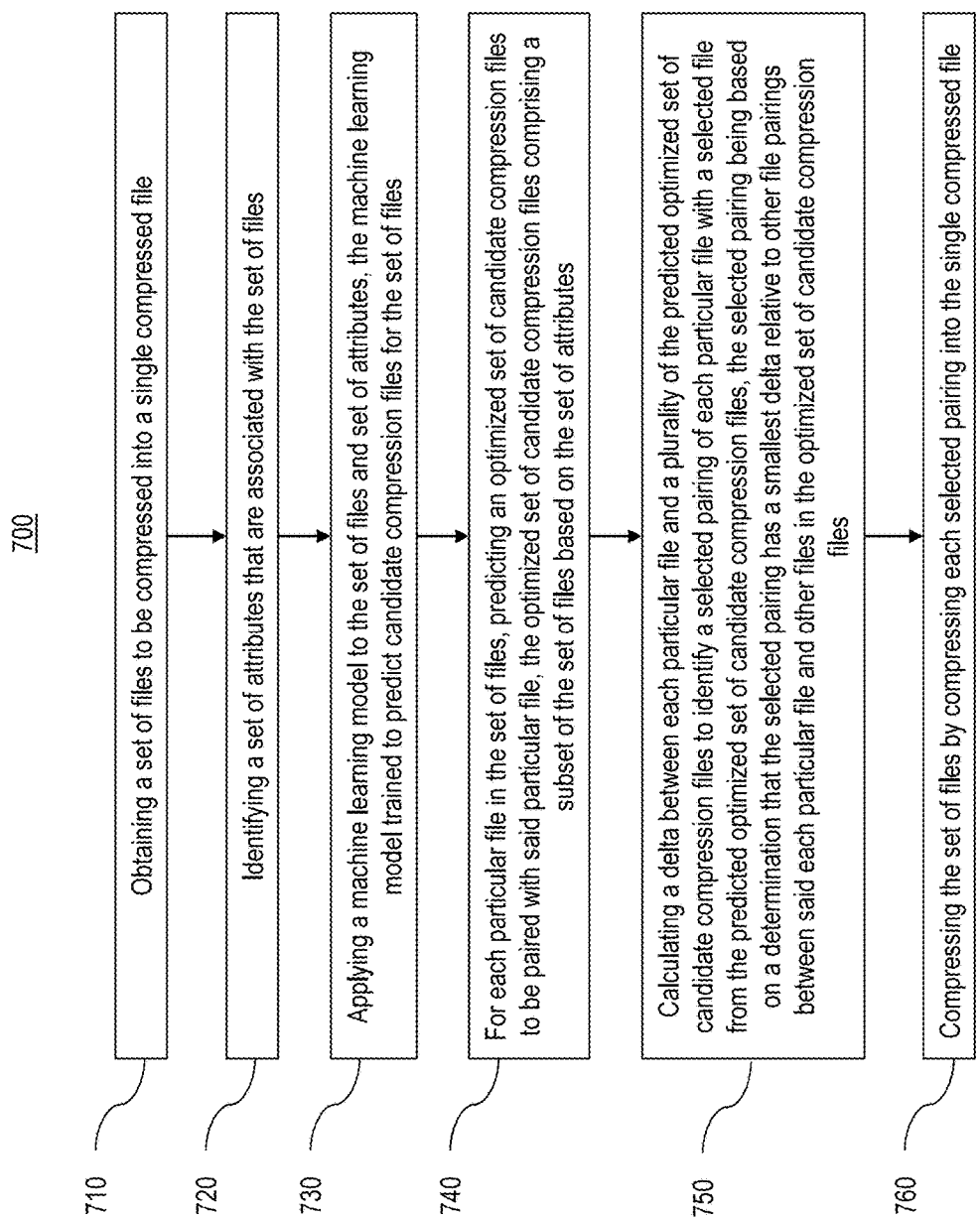

FIGS. 6-7 illustrate various embodiments of flow diagrams having a plurality of acts for performing pair-wise delta compression according to disclosed embodiments.

For instance, FIG. 6 illustrates a flow diagram 600 that includes various acts (act 610, act 620, act 630, act 640, and act 650) associated with exemplary methods that can be implemented by computing system 210 for performing pair-wise delta compression and which includes predicting optimized sets of candidate compression files for different target files included in a set of files to reduce the computational expense of computing deltas for determining which file pairs should be compressed.

As shown, the first illustrated act includes an act of obtaining a set of files into a single compressed file (act 610).

These files can include any file of any type that is capable of being compressed. The system then identifies a set of attributes that are associated with each file in the set of files and/or each possible file pair in the set of files (act 620). By identifying different attributes about the files and/or file pairs, the system is able to predict the file pairs with the smallest deltas in a faster, more efficient manner than having to calculate all of the deltas and then select the lowest delta from all possible file pairs.

For each particular file in the set of files, the system predicts an optimized set of candidate compression files to be paired with said particular file (act 630). The optimized set of candidate compression files comprises a subset of the set of files selected based on the set of attributes. The attributes can include the namespace or naming conventions of the files, as well as attributes of the content contained in the files, as will be described in more detail below.

By predicting an optimized set of candidate compression files, systems are able to significantly reduce the computational expense of calculating deltas, because now systems only have to calculate deltas for a limited number of file pairs, instead of all possible file pairs.

The disclosed methods also include calculating a delta between each particular file and a plurality of the predicted optimized set of candidate compression files, but less than all of the files, to identify a selected pairing of each particular file with a selected file from the predicted optimized set of candidate compression files (act 640) that have the lowest or relatively lower deltas from the possible options. Alternatively, in some embodiments, the system calculates a delta between each particular file and each file in the predicted optimized set of candidate compression files that correspond to the particular file. By calculating every delta possible, the system is able to identify the selected pairing with the lowest delta from all possible file pairs.

The selected pairing is identified based on a determination that the selected pairing has a smallest delta relative to other file pairings between said each particular file and other files in the optimized set of candidate compression files. Notably, the calculation of the delta is only for the particular file relative to the predicted optimized set of candidate compression files, rather than for all files. This reduces overall processing requirements and costs associated with the overall file compression.

Finally, the system compresses the set of files by selectively compressing each of the selected pairings into the single compressed file (act 650). This results in a single compressed file in a more efficient, faster process, as well as achieving better compression ratios for the set of files being compressed into the single compressed file.

As noted above, the selected pairs of files to be compressed in pair-wise compression are based on the system's identification of correlating attributes of the files in the set of files. These attributes, for example, include attributes related to individual files and/or possible file pairs included in the set of files.

In some instances, systems determine a weighting scheme to be applied to the various attributes in order to weight certain attributes more than others during the prediction process of the optimized sets. For example, if the deep learning model learns that certain attributes are better predictors of candidate compression files, the deep learning model can adjust the weighting scheme to weight those certain attributes more heavily than other attributes which contribute less to the accuracy of the candidate compression file accuracy.

If the system determines that an increase in accuracy can be achieved, the system generates a modification of the weighting scheme and applies it to the combination of attributes. Furthermore, in some instances, systems can choose a limited number of attributes from the attributes that are identified based on whether a user wants to optimize for the shortest compression time, smallest compressed file size, or a combination of both criteria.

In some instances, one or more attributes is determined by: encoding each binary file to a vector. In some instances, one or more attributes is determined by: splitting a file binary array associated with a particular file into a set of bytes array, generating a hash for each byte in the set of bytes, and encoding each file to a hash dictionary.

Additionally, some attributes include a time series feature and/or a vector encoded by a language model. In some instances, language model processing is applied to the file similarity calculation. For example, when language model processing is applied to the set of files, every binary file is considered as a document, such that entries of the binary file are considered as a sentence. Object names in the import are words. A machine learning model configured to convert tokens to vectors (e.g., a Word2Vector model) is trained to embed each binary file (document) to vectors which can then be used as model features/attributes. In some instances, systems use a language model (e.g., BERT-based language model).

The referenced attributes can also include a file content similarity feature based on an LCS analysis and/or a multiple file content similarity feature based on a term TFIDF.

In some embodiments, the systems apply TFIDF to the files in multiple ways. For example, in some instances, each binary file is first encoded to 256 TFIDF vectors. Systems then calculate the distance between vectors using distance as a model feature. Additionally, or alternatively, each file binary array is split by continuous 16 bytes in the array, wherein a hash for each set of 16 bytes is created. Systems then apply TDIDF to all of the created hashes and calculate the distance to be used as a model feature.

In order to include a file content similarity feature, the systems generate a control flow graph for each file in the set of files to determine file content similarity and then generate a set of file content similarity features. Additionally, in some instances, the control flow graph is generated by analyzing the set of files using a language model to determine content similarity between files.

In order to include a multiple file content similarity feature, the systems identify multiple pairs of files including a target file and a different file selected from the optimized set of candidate compression files associated with the target files, identify a particular number of continuous bytes for each pair of files, identify which pair of files corresponds to a least number of continuous bytes, and then generate a shingle based on the least number of continuous bytes.

In some embodiments, prior to compressing the set of files, the systems also perform a global optimization to select a particular file pair including a target file and a candidate file from the optimized set of files for each target file relative to one or more different file pairs to generate deltas. This global optimization is configured to select the combination of the selected pairs of files that are predicted to reduce an overall size of a compressed file of the set of files as compared to the compression of selected pairs generated in silo from one another. The global optimization comprises generating a minimum spanning arborescence associated with the deltas from the file pairs.

In some instances, the set of files is compressed using binary delta compression. Furthermore, in some embodiments, the optimized set of candidate compression files is ranked in order to optimize a relative order of possible file pairs included in each optimized set of candidate compression files. This ranking can further aid the global optimization applied to the selected pairs in order to more quickly identify which file pairs should be used during the compression process.

It will be appreciated that the disclosed embodiments beneficially enable computing systems to perform pair-wise compression in a cloud environment, as well as a local environment. This is an improvement over conventional methods for performing pair-wise delta compression which are not capable of compressing data and transmitting compressed data in a cloud environment.

Attention will now be directed to FIG. 7 which illustrates a flow diagram 700 that includes various acts (act 710, act 720, act 730, act 740, act 750, and act 760) associated with exemplary methods that can be implemented by computing system 210 for performing pair-wise delta compression using a machine learning model.

For example, the first illustrated act includes a system obtaining a set of files to be compressed into a single compressed file (act 710). The system then identifies a set of attributes that are associated with the set of files (act 720). The system also applies a machine learning model to the set of files and the set of attributes (act 730). The machine learning model is trained to predict candidate compression files for one or more files in the set of files.

For each particular file in the set of files, the system predicts an optimized set of candidate compression files to be paired with said particular file (act 740). The optimized set of candidate compression files comprises a subset of the set of files selected based on the set of attributes.

Subsequently, the system selectively calculates a delta between each particular file and a plurality of the predicted optimized set of candidate compression files to identify a selected pairing of each particular file with a selected file from the predicted optimized set of candidate compression files (act 750).

The selected pairing is based on a determination that the selected pairing has a smallest delta relative to other file pairings between said each particular file and other files in the optimized set of candidate compression files. Finally, the system compresses the set of files by compressing each selected pairing into the single compressed file (act 760).

In some embodiments, the system determines a modification to the machine learning model that will result in a decrease of a file size of the single compressed file. The system also generates a modified machine learning model by applying the modification to the machine learning model.

The system can then predict a new optimized set of candidate compression files for each file in the set of files based on the applying the modified machine learning model to the set of files and set of attributes. This new optimized set is then used to generate the final compressed file. The set of attributes for each file pair includes one or more of a following: a file property similarity feature, a time series feature, a longest common subsequence, or other file content similarity features.

In view of the foregoing, it should be appreciated that the disclosed embodiments are directed to improved systems and methods which provide technical advantages over conventional methods for performing pair-wise delta compression. Some technical advantages include providing a machine learning model that is able to predict file candidates while maintaining a similar model size as conventional systems, such as DFactory. Additionally, by employing a global optimization, systems are able to achieve an increased overall size benefit (i.e., decreased compressed files). Ultimately, when tested and compared against conventional systems, disclosed systems herein were able to achieve a 16% improvement in compression ratios, or from 13% to 89% as compared to Zip, 7Zip, or WinZip compression techniques.

Additional technical benefits include improved user/client experience, such as faster download and no client change or update stack change. On the server end, there is a significant decrease in cost for pushing updates to clients.

Embodiments of the present invention may comprise or utilize a special purpose or general-purpose computer (e.g., computing system 210) including computer hardware, as discussed in greater detail below. Embodiments within the scope of the present invention also include physical and other computer-readable media for carrying or storing computer-executable instructions and/or data structures. Such computer-readable media can be any available media that can be accessed by a general-purpose or special purpose computer system.

Computer-readable media (e.g., hardware storage device(s) 240 of FIG. 2) that store computer-executable instructions (e.g., computer-executable instructions 218 of FIG. 2) are physical hardware storage media/devices that exclude transmission media. Computer-readable media that carry computer-executable instructions or computer-readable instructions (e.g., computer-executable instructions 218) in one or more carrier waves or signals are transmission media. Thus, by way of example, and not limitation, embodiments of the invention can comprise at least two distinctly different kinds of computer-readable media: physical computer-readable storage media/devices and transmission computer-readable media.

Physical computer-readable storage media/devices are hardware and include RAM, ROM, EEPROM, CD-ROM or other optical disk storage (such as CDs, DVDs, etc.), magnetic disk storage or other magnetic storage devices, or any other hardware which can be used to store desired program code means in the form of computer-executable instructions or data structures and which can be accessed by a general purpose or special purpose computer.

A "network" (e.g., network 230 of FIG. 2) is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmission media can include a network and/or data links that can be used to carry, or desired program code means in the form of computer-executable instructions or data structures, and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general-purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

The present invention may be embodied in other specific forms without departing from its essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method implemented by a computing system for performing pair-wise delta compression, the method comprising:
   obtaining a set of files to be compressed into a single compressed file;
   identifying a set of attributes that are associated with each file in the set of files and a plurality of possible file pairs in the set of files;
   for each particular file in the set of files, predicting an optimized set of candidate compression files to be paired with said particular file, the optimized set of candidate compression files comprising a subset of the set of files based on the set of attributes;
   calculating a delta between each particular file and a plurality of the predicted optimized set of candidate compression files to identify a selected pairing of each particular file with a selected file from the predicted optimized set of candidate compression files, the selected pairing being identified based on a determination that the selected pairing has a smallest delta relative to other file pairings between said each particular file and other files in the optimized set of candidate compression files; and compressing the set of files by compressing each selected pairing into the single compressed file.

2. The method of claim 1, wherein one or more attributes is determined by: encoding each binary file to a vector.

3. The method of claim 1, wherein one or more attributes is determined by: splitting a file binary array associated with a particular file into a set of bytes array;

generating a hash for each byte in the set of bytes; and encoding each file to a hash dictionary.

4. The method of claim 1, wherein one or more attributes includes a time series feature.

5. The method of claim 1, wherein one or more attributes includes a vector encoded by a language model.

6. The method of claim 1, wherein one or more attributes includes a file content similarity feature using longest common subsequence.

7. The method of claim 1, wherein one or more attributes includes a multiple file content similarity feature using term frequency-inverse document frequency.

8. The method of claim 7, further comprising:

generating a control flow graph for each file in the set of files to determine file content similarity; and generating a set of file content similarity features.

9. The method of claim 8, wherein the control flow graph is generated by analyzing the set of files using a language model to determine content similarity between files.

10. The method of claim 1, further comprising:

identifying multiple pairs of files including a target file and a different file selected from the optimized set of candidate compression files associated with the target file;

identifying a particular number of continuous bytes for each pair of files;

identifying which pair of files corresponds to a least number of continuous bytes; and generating a shingle based on the least number of continuous bytes.

11. A computing system for performing pair-wise delta compression, the computing system comprising:

a processor; and a hardware storage device storing computer-executable instructions that are executable by the processor for causing the computing system to:

obtain a set of files to be compressed into a single compressed file;

identifying a set of attributes that are associated with each file in the set of files;

for each particular file in the set of files, predict an optimized set of candidate compression files to be paired with said particular file, the optimized set of candidate compression files comprising a subset of the set of files based on the set of attributes;

calculate a delta between each particular file and a plurality of the predicted optimized set of candidate compression files to identify a selected pairing of each particular file with a selected file from the predicted optimized set of candidate compression files, the selected pairing being based on a determination that the selected pairing has a smallest delta relative to other file pairings between said each particular file and other files in the optimized set of candidate compression files; and compress the set of files by compressing each selected pairing into the single compressed file.

12. The computing system of claim 11, wherein the computer-executable instructions are executable by the processor to further cause the computing system to:

prior to compressing the set of files, performing a global optimization to select a particular file pair including a target file and a candidate file from the optimized set of files for each target file relative to one or more different file pairs to generate deltas to reduce an overall size of a compressed file of the set of files.

13. The computing system of claim 12, wherein the global optimization comprises generating a minimum spanning arborescence associated with the deltas from the files pairs.

14. The computing system of claim 11, wherein the set of files is compressed using binary delta compression.

15. The computing system of claim 11, wherein the optimized set of candidate compression files is ranked in order to optimize a relative order of possible file pairs.

16. The computing system of claim 11, wherein the computer-executable instructions are executable by the processor to cause the computing system to perform pair-wise compression in a cloud environment.

17. A method for performing pair-wise delta compression, the method comprising:

obtaining a set of files to be compressed into a single compressed file;

identifying a set of attributes that are associated with the set of files;

applying a machine learning model to the set of files and set of attributes, the machine learning model trained to predict candidate compression files for the set of files;

for each particular file in the set of files, predicting an optimized set of candidate compression files to be paired with said particular file, the optimized set of candidate compression files comprising a subset of the set of files based on the set of attributes;

calculating a delta between each particular file and a plurality of the predicted optimized set of candidate compression files to identify a selected pairing of each particular file with a selected file from the predicted optimized set of candidate compression files, the selected pairing being based on a determination that the selected pairing has a smallest delta relative to other file pairings between said each particular file and other files in the optimized set of candidate compression files; and compressing the set of files by compressing each selected pairing into the single compressed file.

18. The method of claim 17, further comprising:

determining a modification to the machine learning model that will result in a decrease of a file size of the single compressed file; and generating a modified machine learning model by applying the modification to the machine learning model.

19. The method of claim 18, further comprising:

predicting a new optimized set of candidate compression files based on the applying the modified machine learning model to the set of files and set of attributes.

20. The method of claim 18, wherein the set of attributes for each file pair includes one or more of a following: a file property similarity feature, a time series feature, a longest common subsequence, or other file content similarity features.

* * * * *